United States Patent
Nakamura

(10) Patent No.: US 7,829,365 B2
(45) Date of Patent: Nov. 9, 2010

(54) MICRO ELECTRO-MECHANICAL SYSTEM AND METHOD OF MANUFACTURING THE SAME

(75) Inventor: Makiko Nakamura, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 473 days.

(21) Appl. No.: 11/976,678

(22) Filed: Oct. 26, 2007

(65) Prior Publication Data

US 2008/0224319 A1    Sep. 18, 2008

(30) Foreign Application Priority Data

Mar. 13, 2007    (JP) .............. 2007-063114

(51) Int. Cl.
*H01L 21/00*    (2006.01)
(52) U.S. Cl. .............. 438/52; 438/53; 257/E29.324
(58) Field of Classification Search .............. 438/52, 438/53; 257/E29.324
See application file for complete search history.

(56) References Cited

U.S. PATENT DOCUMENTS 5,188,983 A    2/1993    Guckel et al.

FOREIGN PATENT DOCUMENTS

| JP | 2005-033775 | | 2/2005 |
|---|---|---|---|
| JP | 2006-100745 | A | 4/2006 |
| JP | 2006-174174 | | 6/2006 |
| JP | 2006-186634 | | 7/2006 |
| JP | 2007-142628 | A | 6/2007 |
| JP | 2008-141307 | A | 6/2008 |
| WO | WO-2005-086533 | | 9/2005 |
| WO | WO-2006/035762 | A1 | 4/2006 |

OTHER PUBLICATIONS

Emmanuel P. Quévy et al. "Back-End-Of-Line Poly-Sige Disk Resonators," MEMS 2006, Istanbul, Turkey, Jan. 22-26, 2006, pp. 234-237.

*Primary Examiner*—Bradley K Smith
*Assistant Examiner*—Amar Movva
(74) *Attorney, Agent, or Firm*—Rabin & Berdo, P.C.

(57) ABSTRACT

A micro electro-mechanical system, which can be stably formed so as to prevent sticking of a movable part and which has a narrow gap, and a method of manufacturing the same are provided. The micro electro-mechanical system includes at least one fixed electrode formed above a principal surface of a semiconductor substrate and at least one movable electrode formed on the principal surface. The at least one movable electrode includes the movable part separated from the principal surface and the at least one fixed electrode. The movable part is movable with respect to the principal surface and the at least one fixed electrode. The method of manufacturing the micro electro-mechanical system includes a sacrificial film formation step for forming a sacrificial film above the principal surface, an electrode layer formation step for forming an electrode layer above the principal surface so as to cover over the sacrificial film, an etching step for partially etching the electrode layer via a pattern so as to form the at least one electrode and the at least one fixed electrode, a sacrificial film removal step for removing the sacrificial film, and a conducting film formation step for forming a conducting film on surfaces of the at least one electrode and the at least one fixed electrode.

14 Claims, 8 Drawing Sheets

MICRO ELECTRO-MECHANICAL SYSTEM AND METHOD OF MANUFACTURING THE SAME

BACKGROUND OF THE INVENTION

1. Field of the Invention

The present invention relates to a micro electro-mechanical system (MEMS) and a method of manufacturing the same.

2. Description of the Related Art

A Micro Electro-Mechanical System (MEMS) is a device in which electric circuits (control part) and mechanical macrostructures (movable part) are integrated on one substrate. The micro electro-mechanical system is manufactured by using various microfabrication technologies such as semiconductor manufacturing technology and laser processing technology. In various industrial fields such as information and communication, medical treatment, bio, and cars, the micro electro-mechanical system is a key device which is small, highly accurate, and excellent in power saving. A MEMS resonator utilizing the MEMS technology drives an oscillator formed by a silicon micro-fabrication technology and resonates the oscillator by utilizing an electrostatic force and electromagnetic force. Since the oscillator of the MEMS resonator changes it's physical properties, such as a resonance frequency, dependent on variations of temperature, pressure, etc., the oscillator of the MEMS resonator is applied to various oscillatory sensors. The MEMS resonator is applied to, for instance, an infrared sensor in which a resonance frequency of the oscillator varies dependent on stress relaxation of the oscillator due to infrared absorption and thermal expansion. The MEMS resonator is also applied to a pressure sensor utilizing a change of resonance frequency of the oscillator due to strain.

FIGS. 1A and 1B are respectively a perspective view and a cross-sectional view of a force transducer including a MEMS resonator described in U.S. Pat. No. 5,188,983 (document D1). The force transducer includes a beam 34 which functions as an oscillator. The beam 34 is consisted of poly-silicon formed on a silicon substrate 31 having a cavity 32. The beam 34 is covered with an outer shell 40 formed with poly-silicon similarly. As shown in FIG. 1A, edges of the beam 34 are supported by the silicon substrate 31 connected thereto, so that spaces are provided on and below the beam 34. A capacitor is formed by an electrode 43 formed at one edge of the beam 34 and a metallic pad 42 formed on the outer shell 40. An electrode 44 formed at the other edge of the beam 34 is utilized for supplying an excitation signal to oscillate the beam 34. External force applied on the beam 34 makes the resonance frequency of the beam 34 vary. A space surrounding the beam 34 is formed by removing a sacrificial film by means of an etching method. After forming the sacrificial film, an outer shell 40 is formed and patterned.

In document D1, MEMS resonators having structures shown in FIGS. 2A to 2C are also described. The MEMS resonators of FIGS. 2A to 2C is a typical electrostatic capacitance type MEMS. The MEMS resonator of FIG. 2A having a cantilever structure includes a fixed electrode 2 and a movable electrode 1 which functions as an oscillator. These electrodes form a capacitor for accumulating electric charges. The movable electrode 1 vertically oscillates as shown in FIG. 2A, and a change of the electric capacitance corresponding to a change of a gap length between the movable electrode 1 and the fixed electrode 2 is output as an outgoing signal. The MEMS resonator of FIG. 2B having an interleaved structure includes a movable electrode 1 and fixed electrodes 2, both of which form a capacitor for accumulating electric charges. The movable electrode 1 horizontally oscillates as shown in FIG. 2B, and a change of the electric capacitance corresponding a change of area of the capacitor is output as an outgoing signal. The MEMS resonator of FIG. 2B is sensitive because the change of the electric capacitance when the change of area of the capacitor increases at oscillation. However, the MEMS resonator of FIG. 2B needs a large excitation energy due to its large mass. The MEMS resonator of FIG. 2C having a tuning fork structure includes a movable electrode 1 and a fixed electrode 2 both of which form a capacitor for accumulating electric charges. The movable electrode 1 horizontally oscillates as shown in FIG. 2B, and a change of the electric capacitance corresponding to a change of a gap length between the movable electrode 1 and the fixed electrode 2 is output as an outgoing signal. A sensitivity of the MEMS resonator of FIG. 2C is improved by narrowing a gap length between the movable electrode 1 and the fixed electrode 2.

Usually, the movable part such as the movable electrodes is fabricated by forming a sacrificial film as described in document D1. A method of separating the movable part from the substrate by etching sacrificial film is utilized. As the method of etching the sacrificial film, a wet etching method is usually utilized. In the wet etching method, a gap between the movable part and fixed part is narrowly formed. Therefore, there is a possibility that sticking phenomena may occur due to surface tension of an etchant in a drying process after etching the sacrificial film. The sticking phenomena means that the movable part adsorbs to fixed part due to the surface tension of the etchant. The sticking phenomena tend to occur as the gap length between the movable part and fixed part decreases. Therefore, it is difficult to stably manufacture a MEMS resonator with a narrow gap such as the tuning folk structure as shown in FIG. 2C at a high yield rate.

SUMMARY OF THE INVENTION

The present invention aims to provide a micro electro mechanical system that can be formed so as to prevent sticking of movable parts and includes a narrow gap, and a method of manufacturing the same.

According to a first aspect of the present invention, there is provided a method of manufacturing a micro electromechanical system comprising at least one fixed electrode formed above a principal surface of a semiconductor substrate and at least one movable electrode formed on the principal surface, the at least one movable electrode including a movable part separated from the principal surface and the at least one fixed electrode, the movable part movable with respect to the principal surface and the at least one fixed electrode. The method comprises a sacrificial film formation step for forming a sacrificial film above the principal surface, an electrode layer formation step for forming an electrode layer above the principal surface so as to cover over the sacrificial film, an etching step for partially etching the electrode layer via a pattern so as to form the at least one electrode and the at least one fixed electrode, a sacrificial film removal step for removing the sacrificial film, and a conducting film formation step for forming a conducting film on surfaces of the at least one electrode and the at least one fixed electrode.

According to a second aspect of the present invention, there is provided a method of manufacturing a micro electro-mechanical system comprising at least one fixed electrode formed above a principal surface of a semiconductor substrate and at least one movable electrode formed on the principal surface, the at least one movable electrode including a movable part separated from the principal surface and the at least one fixed electrode, the movable part movable with respect to the principal surface and the at least one fixed electrode. The method comprises a sacrifical film formation step for forming a sacrifical film above the principal surface, an electrode layer formation step for forming an electrode layer above the principal surface so as to cover over the sacrifical film, an etching step for partially etching the electrode layer via a pattern so as to form the at least one electrode and the at least one fixed electrode, a sacrifical film removal step for removing the sacrifical film, a thickness estimation step for measuring a resonance frequency of the at least one movable electrode so as to estimate a thickness of a conducting film on the basis of a difference between a measured resonance frequency and a design value, and a conducting film formation step for forming the conducting film on surfaces of the at least one electrode and the at least one fixed electrode, the conducting film having a thickness in accordance with the thickness estimated in the thickness estimation step.

According to a third aspect of the present invention, there is provided a micro electromechanical system comprising at least one fixed electrode formed above a principal surface of a semiconductor substrate, and at least one movable electrode formed on the principal surface, the at least one movable electrode including a movable part separated from the principal surface and the at least one fixed electrode, the movable part movable with respect to the principal surface and the at least one fixed electrode. The micro electro-mechanical system further comprising a conduction film with which surfaces of the at least one electrode and the at least one fixed electrode are covered.

According to the method of manufacturing the MEMS of the present invention, the at least one fixed electrode and the at least one movable electrode are formed so that a gap between the fixed electrode and the movable electrode is formed largely in an initial step. After removing the sacrifical film, the conducting film is formed on the fix electrode so that the gap has a design value. Therefore, it is possible to provide a micro electro mechanical system which can be stably formed so as to prevent sticking of the movable part and have a narrow gap.

DETAILED DESCRIPTION OF THE INVENTION

Figure 1A:
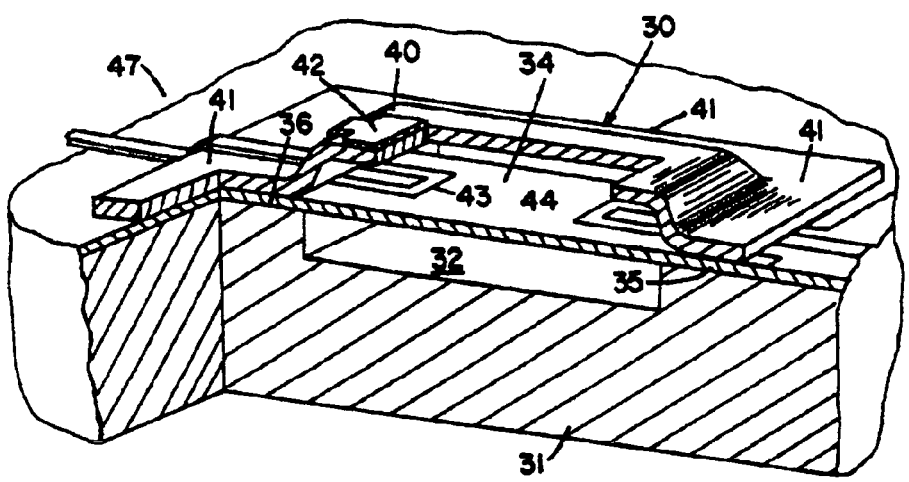
FIG. 1A is a perspective view showing a force transducer having a conventional MEMS resonator.
Figure 1B:
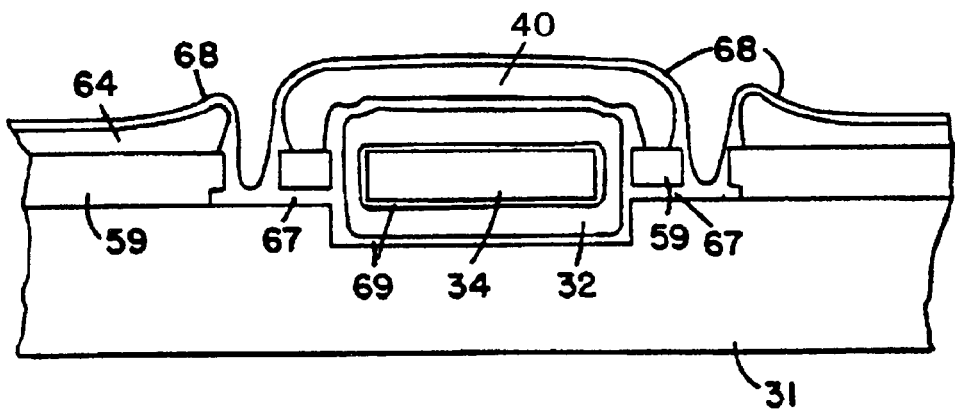
FIG. 1B is a cross-sectional view showing the force transducer having the conventional MEMS resonator.
Figure 2A:
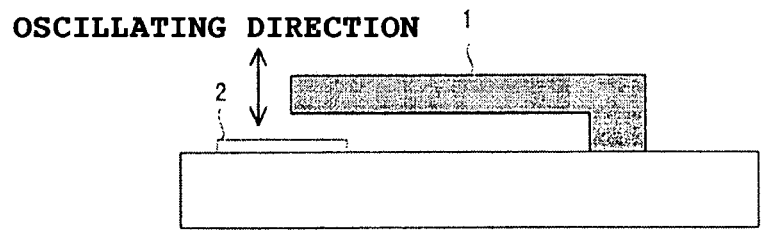
FIG. 2A is a side view showing a conventional cantilever type resonator.
Figure 2B:
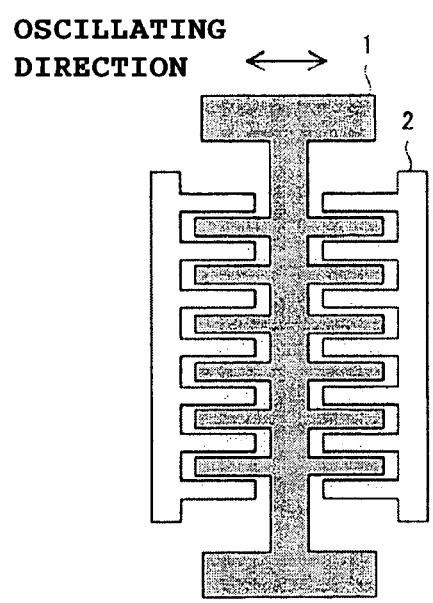
FIG. 2B is a top view showing a conventional inter-digital resonator.
Figure 2C:
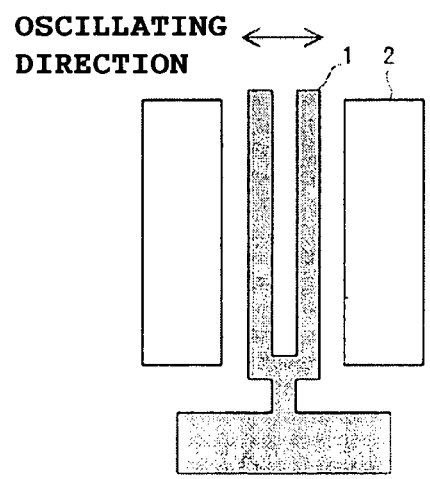
FIG. 2 C is a top view showing a conventional tuning fork type resonator.

First and second embodiment in accordance with the present invention will now be described in reference to the drawings. Elements and parts, which are substantially same or equivalent to each other, are denoted by the same numerals in the drawing.

First Embodiment

Figure 3A:
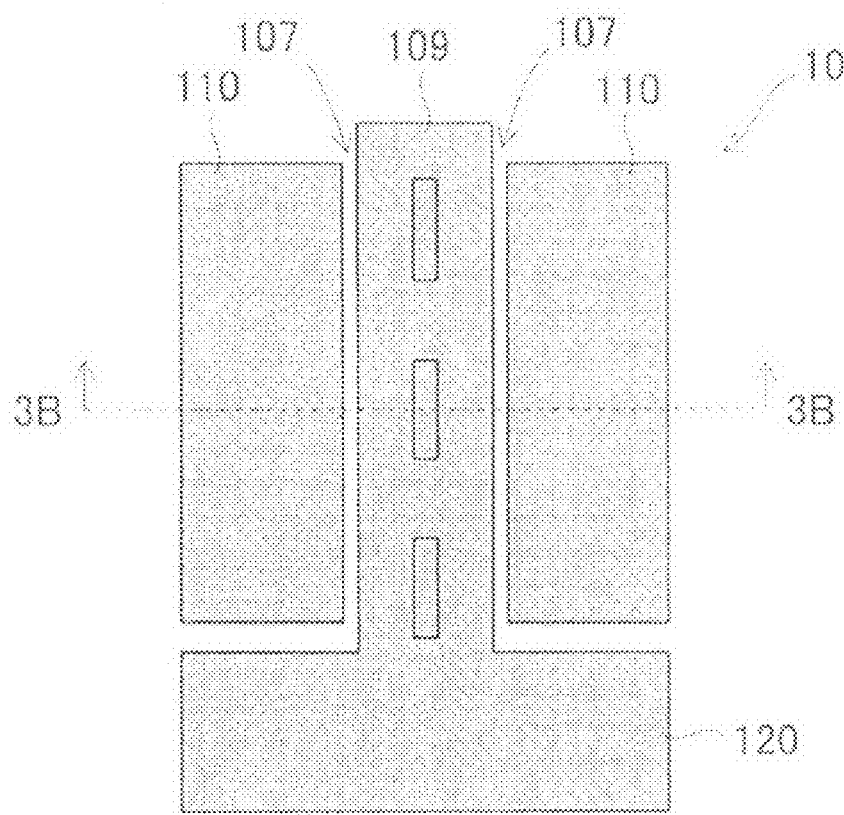
FIG. 3A is a top view showing a MEMS resonator of a first embodiment of the present invention.
Figure 3B:
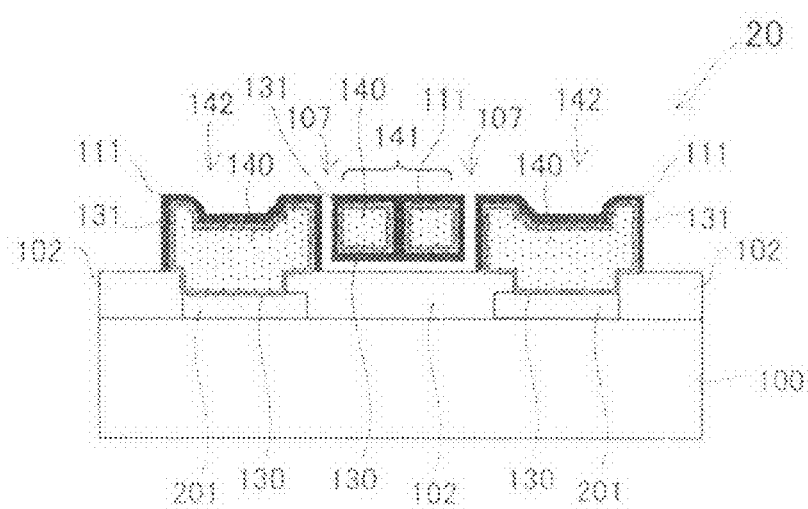
FIG. 3B is a cross-section showing the MEMS resonator of the first embodiment in 3B-3B line in FIG. 3A.

FIG. 3A is a top view showing a MEMS resonator 10 which is the first embodiment of the present invention. FIG. 3B is a cross-section of the MEMS resonator 10 taken in 3B-3B line of FIG. 3A. The MEMS resonator 10 having a tuning fork type structure includes an anchor part 120, a movable electrode 109 connected to the anchor part 120, and fixed electrodes 110 formed on both sides of the movable electrode 109 via a gap 107. As shown in FIG. 3B, wiring-layers 101 such as a conductive material of tungsten W etc. and insulation films 102 such as $SiO_2$ etc. are formed on a silicon substrate 100. Since it is necessary to supply electric powers to the fixed electrodes 110 and the movable electrode 109 for vibrational excitations, the fixed electrodes 110 and the movable electrode 109 are formed with a conductive material such as impurity doped poly-silicon or poly-SiGe. The fixed electrodes 110 are electrically connected to the wiring-layers 101, respectively. The movable electrode 109, which is formed so as to separate from the fixed electrodes 110 and the insulation films 102 via the gap 107, is supported by the anchor part 120 connected to the silicon substrate 100. Conducting films 111 such as tungsten are formed on surfaces of the fixed electrodes 110 and the movable electrode 109. The thickness of the conducting film 111 defines a gap length of the gap 107. Across the movable electrode 109 and the fixed electrodes 110 of the MEMS resonator 10, input signals on which high frequency signals is superimposed to the DC bias voltage are applied. In response to the input signals of a specific high frequency, the movable electrode 109 resonates resulting from an electrostatic force caused between the movable electrode 109 and the fixed electrodes 110. A resonance frequency f0 of the movable electrode 109 varies in dependent on various parameters such as a material of the movable electrode 109, a structure, a stress, a shape, the gap length, and an applied voltage, etc.

Figure 4A:
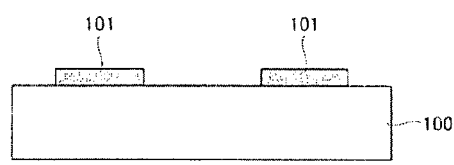
FIG. 4A is a cross-section showing the MEMS resonator that is the first embodiment of the present invention in an initial step.
Figure 4B:
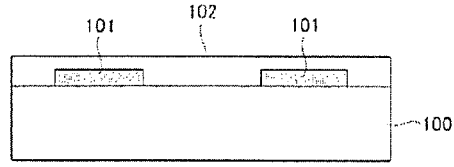
FIG. 4B is a cross-section showing the MEMS resonator that is the first embodiment of the present invention in a further step.
Figure 4C:
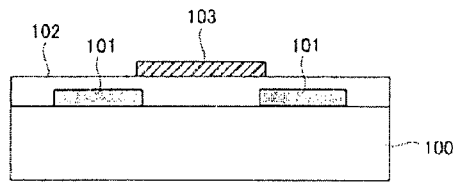
FIG. 4 C is a cross-section showing the MEMS resonator that is the first embodiment of the present invention in a further step.
FIG. 4D is a cross-section showing the MEMS resonator that is the first embodiment of the present invention in a further step.
FIG. 4E is a cross-section showing the MEMS resonator that is the first embodiment of the present invention in a further step.
FIG. 4F is a cross-section showing the MEMS resonator that is the first embodiment of the present invention in a further step.
FIG. 4G is a cross-section showing the MEMS resonator that is the first embodiment of the present invention in a further step.
FIG. 4H is a cross-section showing the MEMS resonator that is the first embodiment of the present invention in a further step.
Figure 4D:
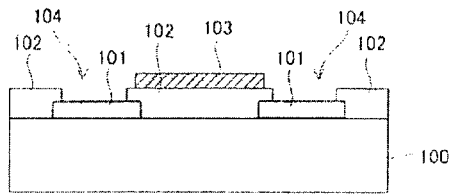
Figure 4E:
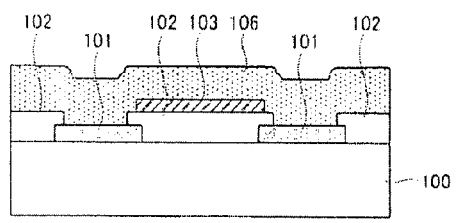
Figure 4F:
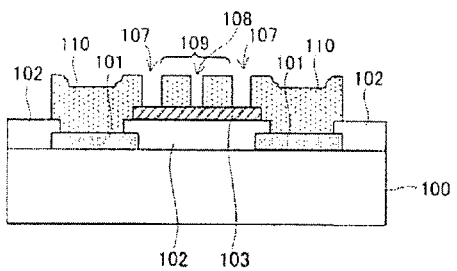
Figure 4G:
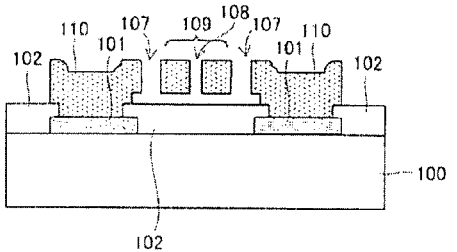
Figure 4H:
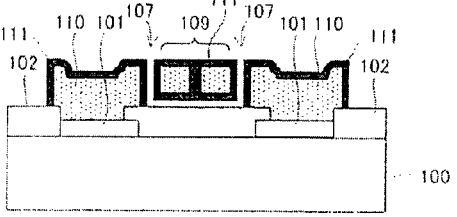

A method of manufacturing the MEMS resonator 10 of FIGS. 3A and 3B will now be described with reference to the drawings. FIGS. 4A to 4H are cross-sections of the MEMS resonator 10 in each manufacturing steps. FIG. 5A to FIG. 5E are top views corresponding to the cross-sections of FIGS. 4A to 4H. FIG. 4A is a cross-section taken along 4A-4A line of FIG. 5A. FIG. 4D is a cross-section taken along 4D-4D line of FIG. 5B. FIG. 4F is a cross-section taken along 4F-4F line of FIG. 5C. FIG. 4G is a cross-section taken along 4G-4G line of FIG. 5D. FIG. 4H is a cross-section taken along 4H-4H line of FIG. 5E. Top views of the MEMS resonator 10 corresponding to FIGS. 4B, 4C, and 4E are not shown.

Figure 5A:
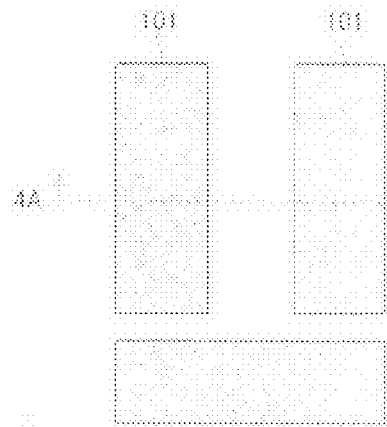
FIG. 5A is a top view showing the MEMS resonator that is the first embodiment of the present invention in a further step.

A tungsten film having a thickness of about 1 um is deposited on a silicon substrate 100 by, for instance, a sputter-deposition technique. The tungsten film is patterned by a photomask formation and a etching treatment so as to form wiring-layers 101 (FIG. 4A and FIG. 5A). As shown FIG. 5A, the wiring-layers 101 are formed on regions above which fixed electrodes 110 and anchor part 120 will be formed in a later step. The wiring-layers 101 is connected to external input-output terminals (not shown) from and to which output signals and voltages are derived and applied.

In a next step, an insulation film 102 consisting of $SiO_2$, whose thickness is, for instance, about 2 um, is formed by an AP-CVD method etc. on the silicon substrate 100 on which the wiring-layers 101 are formed. The insulation film 102 is smoothly formed by a CMP method (FIG. 4B).

In a next step, germanium or tungsten with a thickness of, for instance, about 1 um is deposited on the insulation film 102 by a LP-CVD method etc. The germanium or tungsten film is patterned by an anisotropic dry etching processing utilizing an etching gas such as $CF_4$, thus forming a sacrifical film 103. The germanium or tungsten film is partially removed by the patterning process excluding a part on which a movable electrode 109 will be formed in a later step (FIG. 4C). The part of the germanium or tungsten film corresponds to the sacrifical film 103.

Figure 5D:
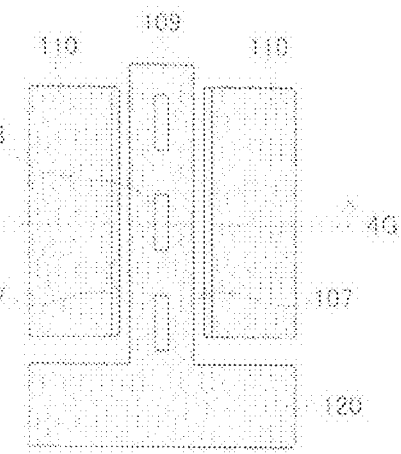
FIG. 5D is a top view showing the MEMS resonator that is the first embodiment of the present invention in a further step.
Figure 5B:
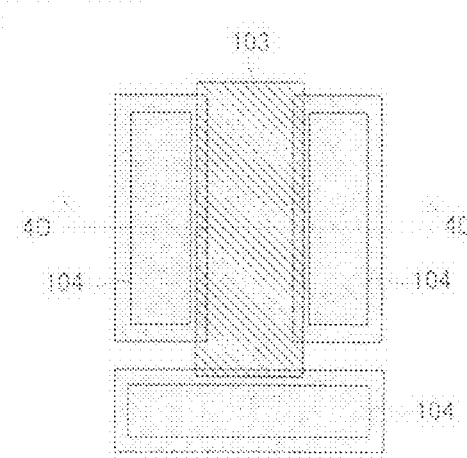
FIG. 5B is a top view showing the MEMS resonator that is the first embodiment of the present invention in a further step.

In a next step, a photomask is formed on the insulation film 102. Apertures 104 are formed by an anisotropic dry etching processing utilizing an etching gas such as $CF_4$ so that surfaces of the wiring-layers 101 formed in the region corresponding to the fixed electrodes 110 and anchor part 120 are partially exposed (FIG. 4D and FIG. 5B).

In a next, an electrode material 106 such as poly-silicon or Poly-SiGe whose resistances are controlled by doping impurities such as phosphorus (P) and boron (B) is deposited on the structure of FIG. 4D as to have a thickness of about 1 to 5 um (FIG. 4E). Subsequently, by utilizing a photomask formed on the electrode material 106, the electrode material 106 is patterned by an anisotropic dry etching processing of a etching gas such as $CF_4$ so as to form a movable electrode 109, fixed electrodes 110, and a anchor part 120. Slits 108 are formed into the movable electrode 109 (FIG. 4F and FIG. 5C). The patterning process of the electrode material 106 is performed so that edges of the movable electrode 109, the fixed electrodes 110, the anchor part 120, and the slits 108 is vertical and smooth. Through the patterning process of the electrode material 106, a gap length of a gap 107 between the fixed electrodes 110 and the movable electrode 109 is, for instance, 0.3 to 11.0 um. It is configured that the gap length in this step is larger that a final gap length of a final product. By forming the gap 107 having a comparatively large gap length in this step, it is possible to prevent sticking phenomena causing after removing the sacrifical film 103. Each of the slits 108 formed into the movable electrode 109 is formed so as to have a width 0.1 um smaller than the gap length of the gap 107. The slits 108 is utilized in a later step for easily flow an etchant into the sacrifical film 103 formed under the movable electrode 109, thus the sacrifical film 103 is easily etched. The slits 108 may be formed in a pattern in which a plurality of the slits 108 are uniformly arranged on a center line of the electrode 109 as shown in FIG. 5C. The pattern of the slits 108 may be changed into another one in which one slit extends from a connection of the movable electrode 109 and the anchor part 120 to one end of the movable electrode 109.

In a next, the sacrifical film 103 is etched by immersing the structure of FIG. 4F in hydrogen peroxide solution $H_2O_2$ as an etchant. By entering the etchant into the slits 108 and the gap 107, the sacrifical film is easily removed, so that the movable electrode 109 is separated from the silicon substrate 100. A space allowing vibration of the movable electrode 109 is formed. The structural body, from which the sacrifical film 103 is removed, is washed, and dried (FIG. 4G and FIG. 5D).

Figure 5E:
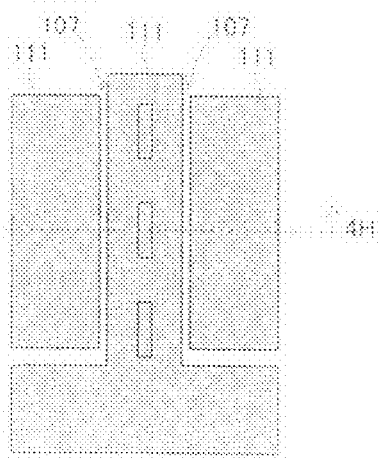
FIG. 5E is a top view showing the MEMS resonator that is the first embodiment of the present invention in a further step.
Figure 5C:
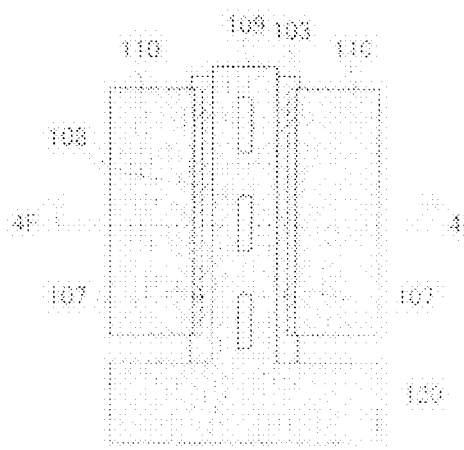
FIG. 5 C is a top view showing the MEMS resonator that is the first embodiment of the present invention in a further step.

In a next step, conducting films 111 consisting of tungsten etc. is formed on the structural body of FIG. 4G by, for example, a LP-CVD method utilizing six fluoride tungsten $WF_6$ and hydrogen H2 as a reactant gas (FIG. 4H and FIG. 5E). When a tungsten CVD film is formed as the conducting films 111 at low temperature of 450° C. or less, the tungsten CVD film is easily deposited only on a conductive material selectively. Thus, the conducting film 111 is formed selectively on the electrode material. That is, upper and side surface of the fixed electrodes 110 and whole face of the movable electrode 109 are covered with the conducting film 111. A thickness of the conducting film 111 defines the gap length of the gap 107 between the fixed electrodes 110 and the movable electrode 109. Accordingly, the gap length of the gap 107 is controlled by adjusting the thickness of the conducting film 111 in this step. When a gap length of the gap 107 is, for instance, 0.5 um before forming the conducting film 111, and the conducting film 111 with a thickness of 0.2 um is uniformly formed, it is estimated that a final gap length of the gap 107 is 0.1 um. Excluding tungsten, a material for forming the conducting film 111 may be other metals such as molybdenum and titanium.

In the manufacturing method of the MEMS resonator of the first embodiment according to the present invention, in the initial step, the gap formed between the movable electrode and the fixed electrode is formed so as to have a relatively large gap length. Then, the conducting film is uniformly deposited on the surfaces of the movable electrode and the fixed electrode after the removal step of the sacrificial film including the drying step, thus the conducting film makes the gap length in the initial step narrow in comparison with that in the initial step. The sticking phenomena can be effectively prevented in comparison with the conventional manufacturing method in which a narrow gap is formed at the time of etching the sacrificial film. Therefore, it is possible to prevent sticking phenomena, and thus form a stable narrow gap of about 0.1 um. Therefore, it is possible to manufacture an electrostatic capacitance type MEMS having a large capacitance and high sensitivity by decreasing a gap between electrodes.

Modification

In next, a modification of the method of manufacturing the MEMS resonator 10 which is the first embodiment of the present invention will now be described below. The variation is different from the method of manufacturing the MEMS resonator 10 of the first embodiment in the step in which the conducting film on the surface of the fixed electrodes and the movable electrode are formed after removing the sacrificial film. A resonance frequency f0 of a movable electrode of a MEMS resonator, which varies depending on various parameters such as electrode material, a structure, stress, shape, and an applied voltage, is represented by the following equation.

$$f0 = (m/k)1/2/2p \qquad (1)$$

where m is an effective mass and k is a spring constant. The spring constant k, which is not constant, is affected by parameters such as an applied voltage Vp, a gap length of a gap between a movable electrode and a fixed electrode, a thickness of the movable electrode, and a width of the movable electrode. Therefore, when a MEMS resonator structure is designed, parameters such as a gap length of a gap between a movable electrode and a fixed electrode, a shape of a movable electrode are designed on the basis of an empirical rule or a simulation so that the MEMS resonator resonates a desired resonance frequency in accordance with the design. However, due to nonuniformity of thickness of a structural body, inhomogeneous film quality (mass density, composition, and stress), nonuniformity of a gap length d, an observed resonance frequency of the MEMS resonator will be out of a design value. In particular, when the sacrificial film and the structural body are formed with a batch LP-CVD method, a thickness and a quality of the film, which depend on a position of a wafer in the batch, are changed. In addition, a thickness and a quality of the film are different between the batches. Therefore, in the modification of the method, a resonance frequency of a movable electrode is measured in a manufacturing step. An additional conducting film is formed on surface of a movable electrode and fixed electrodes, whose thickness is in accordance with a difference between an observed resonance frequency and a designed resonance frequency. The variation of the method of manufacturing the first embodiment further includes a adjusting step in which a spring constant k and an effective mass m of the movable electrode are changed so that a resonance frequency approaches to a target value.

FIGS. 6A-6H are cross-sections showing a MEMS resonator 20 in according with the present invention. The manufacturing method of the MEMS resonator according to the present invention is described seeing FIGS. 6A-6H.

Figure 6A:
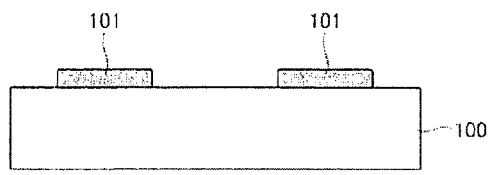
FIG. 6A is a cross-section showing a MEMS resonator that is a modification of the first embodiment of the present invention in an initial step.

Tungsten with a thickness of about 1 um is deposited on a silicon substrate 100 by, for instance, a sputter-deposition technique. The tungsten film is patterned by a photomask formation and an etching treatment, so that wiring-layers 101 are formed (FIG. 6A). The wiring-layers 101 are formed on surface regions of the silicon substrate 100 which regions correspond to regions where fixed electrodes 110 and an anchor part 120 will be formed in a later step. The wiring-layers 101 are connected to external input-output terminals (not shown). Via the wiring-layers 101, voltages and outgoing signals are applied on and derived from the fixed electrodes 110 and the anchor part 120.

Figure 6B:
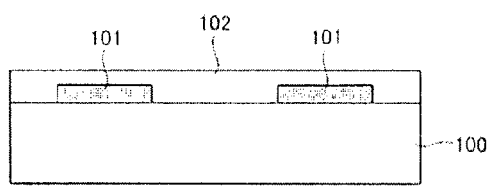
FIG. 6B is a cross-section showing a MEMS resonator that is a modification of the first embodiment of the present invention in a further step.

In a next step, an insulation film 102 with a thickness of about 2 um, which is consisted of, for example $SiO_2$, is formed by utilizing an AP-CVD method etc. on the silicon substrate 100 on which the wiring-layers 101 are formed. The insulation film 102 is smoothly planarized by a CMP method (FIG. 6B).

Figure 6C:
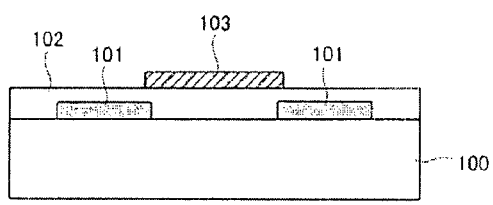
FIG. 6 C is a cross-section showing a MEMS resonator that is a modification of the first embodiment of the present invention in a further step.
FIG. 6D is a cross-section showing a MEMS resonator that is a modification of the first embodiment of the present invention in a further step.
FIG. 6E is a cross-section showing a MEMS resonator that is a modification of the first embodiment of the present invention in a further step.
FIG. 6F is a cross-section showing a MEMS resonator that is a modification of the first embodiment of the present invention in a further step.
FIG. 6G is a cross-section showing a MEMS resonator that is a modification of the first embodiment of the present invention in a further step.
FIG. 6H is a cross-section showing a MEMS resonator that is a modification of the first embodiment of the present invention in a further step.

In a next step, germanium or the tungsten with a thickness of, for instance, about 1 um is deposited on the insulation film 102 by a LP-CVD method etc. The germanium or the tungsten film is patterned by an anisotropic dry etching processing utilizing an etching gas such as $CF_4$, so that a sacrificial film 103 is formed. The sacrificial film 103 formed by the patterning is partially removed excluding a part on which the movable electrode 109 will be formed in a later step (FIG. 6C).

In a next step, a photomask is formed on the insulation film 102. An aperture 104 is formed by an anisotropic dry etching processing using, for instance, an etching gas such as $CF_4$. Surfaces of the wiring-layers 101 formed on the region corresponding to the fixed electrodes 110 and the anchor part 120 are partially exposed (FIG. 6D).

Figure 6D:
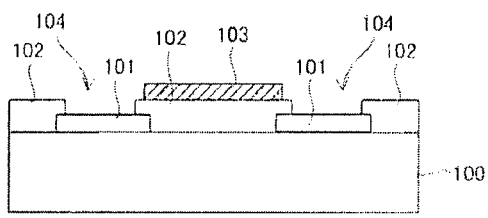
Figure 6E:
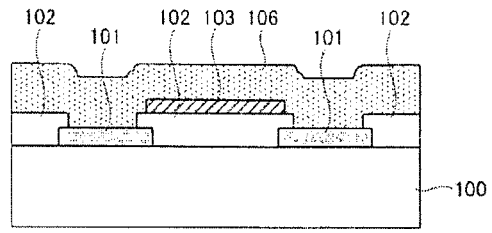
Figure 6F:
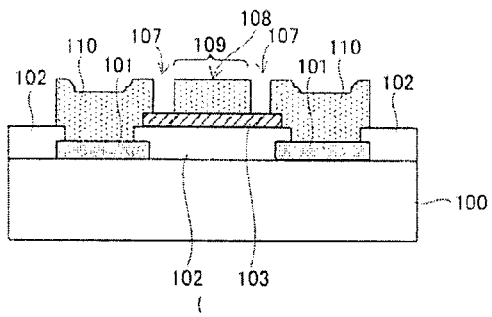

In a next step, an electrode material 106 such as polysilicon or Poly-SiGe whose resistances are controlled by doping impurities such as phosphorus (P) and boron (B) is deposited on upper surfaces of the structural body of FIG. 6D so as to have a thickness of about 1 to 5 um (FIG. 6E). Subsequently, by utilizing a photomask formed on the electrode material 106, the electrode material 106 is patterned by an anisotropic dry etching processing of an etching gas such as $CF_4$ so as to form a movable electrode 109, fixed electrodes 110, and an anchor part 120 (FIG. 6F). The patterning process of the electrode material 106 is performed so that edges of electrode material 106 are vertical and smooth. Through the patterning process of the electrode material 106, a gap length of a gap 107 between the fixed electrode 110 and the movable electrode 109 is, for instance, 0.3 to 1.0 um. It is configured that the gap length of the gap 107 formed in the patterning process is larger than a final gap length of a final product. By forming the gap 107 having a comparatively large gap length in the patterning process, it is possible to prevent a sticking phenomena after removing the sacrifical film 103.

Figure 6G:
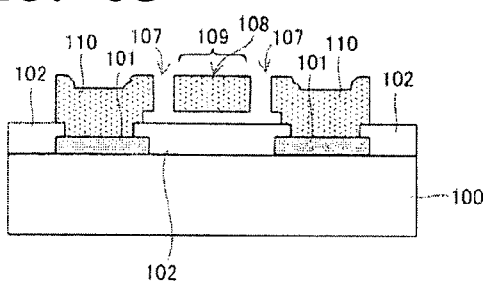

In a next step, the structural body shown in FIG. 6F is immersed in hydrogen peroxide solution $H_2O_2$ so as to etch the sacrifical film 103. By entering an etchant is entered into the gap 107, the sacrifical film 103 is easily removed, so that the movable electrode 108 is separated from the silicon substrate 100, and a space allowing vibration of the movable electrode 108 is formed. The structural body, from which the sacrifical film 103 is removed, is washed and dried (FIG. 6G).

In a next step, a resonance frequency of the movable electrode 109 of the structural body which is processed in the above steps is measured. The measurement of the resonance frequency is performed by utilizing, for example, a process monitoring chip provided on a part of the structural body. On the basis a difference between the measurement of the resonance frequency and a target value, a thickness of a conducting film 111 which will be formed on the movable electrode 109 and the fixed electrodes 110 is estimated. The conducting film 111 having a thickness estimated on the basis of the resonance frequency difference is formed on the surfaces of movable electrode 109 and the fixed electrodes 110, which corresponds to a change of the spring constant k and the effective mass m of the movable electrode 109. Thus, it is possible to approximate the resonance frequency to the target value. As the thickness of the conducting film 111 increases, the spring constant k decreases and the effective mass m increases, thus decreasing the resonance frequency f0, which is apparent from the equation (1). The deposition thickness of the conducting film 111 is estimated on the basis of a relation between the thickness of the conducting film 111 and the resonance frequency or estimated with a simulator of necessary parameters.

Figure 6H:
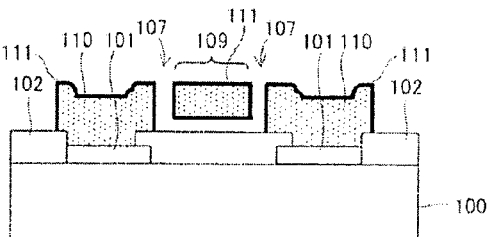

In a next, the conducting film 111 with the estimated thickness is deposited on the surfaces of the movable electrode 109 and the fixed electrodes 110 by, for instance, an ALD (Atomic Layer deposition) method (FIG. 6H). Since the deposition of the conducting film 111 utilizing the ALD method is performed at low temperature in comparison with a CVD method, a reaction rate controlling is decreased due to absorbed material gases. Thus, dose of two material gases are alternated, so that the conducting film 111 can be formed layer by layer. When a tungsten film is formed as the conducting film 111, material gases such as $SiH_4$ and $WF_6$ are alternatively dosed. $SiH_4$ absorbed on the electrodes reacts with $WF_6$, thus tungsten is deposited layer by layer. By utilizing the ALD method, it is possible to control the thickness of the conducting film 111 with a high accuracy. It is also possible to deposit the conducting film 111 by using a usual CVD method when the conducting film 111 is not necessarily formed with a high accuracy. In the adjustment process, the thickness of the conducting film 111 may be estimated for each wafer because the quality of the wafers may be different. The thickness of the conducting film 111 may be estimated for each processing batch or each manufacturing lot.

In the variation of the first embodiment, the gap between the movable electrode and the fixed electrode is formed so that the gap length is larger than a final gap length. After the sacrifical film removal step including the drying process, the conducting film is uniformly deposited to these electrode surfaces, so that the gap length can be decreased. Thus, it is possible to prevent the sticking phenomena effectively. That is, the sticking phenomena can be prevented by utilizing the manufacturing method. A narrow gap of about 0.1 um can be formed with stability. Thus, it is possible to easily manufacture an electrostatic capacitive MEMS having a large capacitance variation and high sensitivity by decreasing a gap length between electrodes. In the modification method, if the resonance frequency of the movable electrode is out of a design value due to different thicknesses and qualities between the structural bodies, the conducting film is deposited on the surfaces of the movable electrode and the fixed electrode so as to have a thickness corresponding to the design value. Since the resonance frequency is controlled by changing the thickness of the conducting film, it is possible to suppress a variation of resonance frequencies between lots, between batches, and between wafers.

Second Embodiment

Figure 7A:
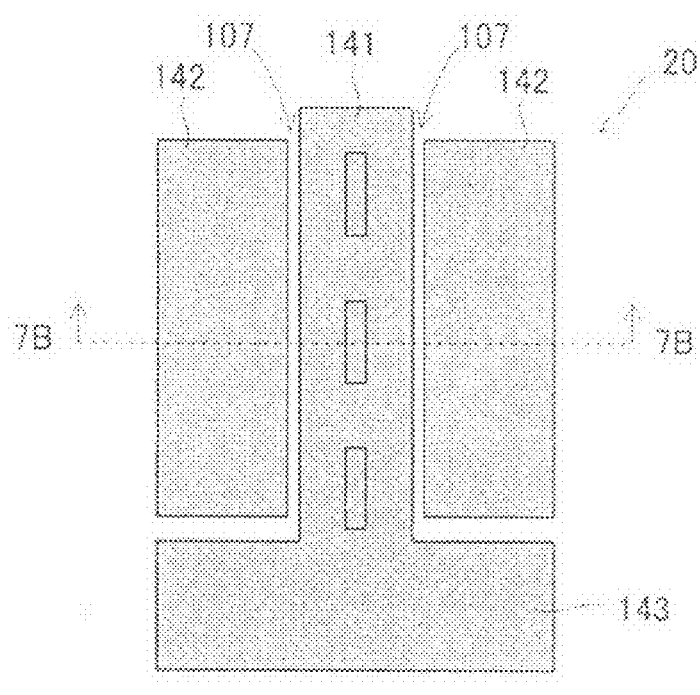
FIG. 7A is a top view showing a MEMS resonator that is a second embodiment of the present invention.
Figure 7B:
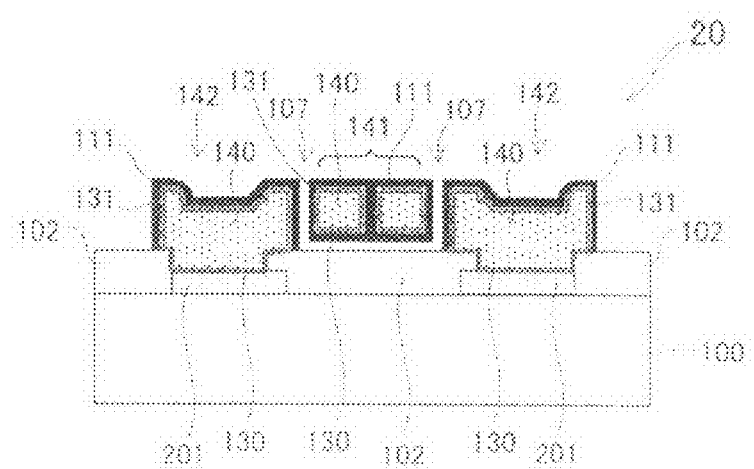
FIG. 7B is a cross-section showing the MEMS resonator of the second embodiment in 7B-7B line in FIG. 7A.

A second embodiment of the MEMS resonator according to the present invention will now be described with reference to the drawings. FIG. 7A is a top view showing a MEMS resonator 20 which is the second embodiment of the present invention. FIG. 7B is a cross-section showing the MEMS resonator 20 taken along 7B-7B line of FIG. 7A. Although a basic structure of the MEMS resonator 20 of the second embodiment is similar to that of the MEMS resonator 10 of the first embodiment, a movable electrode and fixed electrodes of the MEMS resonator 20 are different from the first embodiment. As described in the first embodiment, a movable electrode and fixed electrodes are usually formed from a conductive material such as poly-silicon and Poly-SiGe into which impurities are doped. This is because a single metal employed as the electrode material is not sufficiently hard and not excellent in thermal characteristics such as a thermal expansion coefficient. However, since the poly-silicon and Poly-SiGe are usually deposited by a LP-CVD method which includes a thermal treatment at high temperature for a longer period of time, it is difficult to integrate a MEMS device on the semiconductor device having a circuit part. Therefore, in the second embodiment, a movable electrode and fixed electrodes are formed from a layer structure in which an insulating material and a conductive material are alternatively formed. A high-resistance material and an insulating material, which can be deposited at comparatively low temperature, are utilized while making the movable electrode and the fixed electrodes conductive.

In the MEMS resonator 20 of the second embodiment, the wiring-layers 201 is formed on a silicon substrate 100 from a conductive material such as Al alloys and Cu. An insulation film 102 such as $SiO_2$ is formed. Fixed electrodes 142 and a movable electrode 141 are composed by an insulation film 140 such as AlN or $AL_2O_3$ and metal films 130,131 surrounding the insulation film 140. The metal film 130, which is formed from, for instance, TiN film, is formed on bottom surfaces of the fixed electrode 142 and the movable electrodes 141. The fixed electrode 142 is electrically connected to the wiring-layer 201 via the metal film 130. The metal film 131, which is formed from a multilayer film of, for instance, Ti/TiN is formed on upper and side surfaces of the fixed electrodes 142 and the movable electrode 141. The metal film 131 is electrically connected to the metal film 130 thereunder. The movable electrode 141 is separated from the fixed electrodes 142 and the insulation film 102, thus forming a gap between them. Therefore, the movable electrode 141 is supported by an anchor part 120 coupled to the silicon substrate 100. A conducting film 111 such as tungsten is formed on surfaces of the fixed electrode 142 and the movable electrode 141. The gap length of the gap 107 is defined by a film thickness of the conducting film 111.

In the resonator 20 of the second embodiment, the conducting film 111 is formed on the surfaces of the movable electrode 141 and the fixed electrode 142 in similar to the first embodiment. Final electrode structure and gap 107 between the electrodes are defined by a film thickness of the conducting film 111. The structure is formed for final electrode configuration and inter-electrode gap 107. Each of the movable electrode 141 and the fixed electrodes 142 has a layered structure in which the insulation film 140 and metal films 130,131 are formed. Next, a method of manufacturing the MEMS resonator 20 of the second embodiment of the present invention will be described with reference to the drawings. FIGS. 8A to 8J are cross-sectional views showing the MEMS resonator 20 in several steps.

Figure 8A:
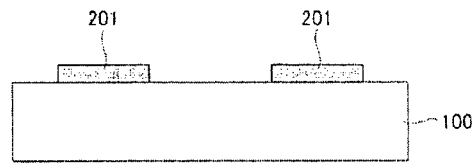
FIG. 8A is a cross-section showing the MEMS resonator of the second embodiment in an initial step.

An aluminum alloy film with a thickness of, for instance, about 1 um is deposited on a silicon substrate 100 by a sputter-deposition technique. The aluminum alloy film is etched away through a photomask by an etching treatment, so that wiring-layers 201 are formed (FIG. 8A). The material of the wiring-layers 201, which is not limited to aluminum alloy, may be copper formed by a damascene process.

Figure 8B:
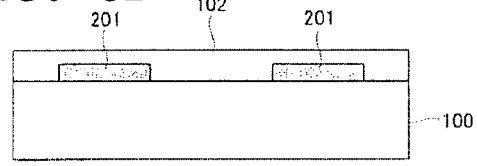
FIG. 8B is a cross-section showing the MEMS resonator of the second embodiment in a further step.

An insulation film 102 consisting of, for instance, $SiO_2$ with a thickness of 2 um is formed with an AP-CVD technique etc. on the silicon substrate 100 on which the wiring-layers 201 are formed. In addition, the insulation film 102 is made smoothly by a CMP technique (FIG. 8B).

Figure 8C:
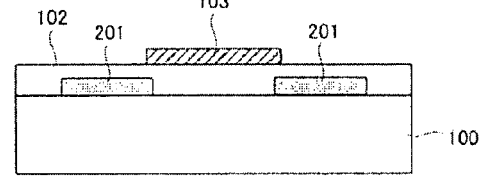
FIG. 8 C is a cross-section showing the MEMS resonator of the second embodiment in a further step.
FIG. 8D is a cross-section showing the MEMS resonator of the second embodiment in a further step.
FIG. 8E is a cross-section showing the MEMS resonator of the second embodiment in a further step.
FIG. 8F is a cross-section showing the MEMS resonator of the second embodiment in a further step.
FIG. 8G is a cross-section showing the MEMS resonator of the second embodiment in a further step.
FIG. 8H is a cross-section showing the MEMS resonator of the second embodiment in a further step.
FIG. 8I is a cross-section showing the MEMS resonator of the second embodiment in a further step.
FIG. 8J is a cross-section showing the MEMS resonator of the second embodiment in a further step.

In a next step, germanium Ge or tungsten W with a thickness of, for instance, about 1 um is deposited on the insulation film 102 by a sputter-deposition technique. The germanium Ge or tungsten W film is patterned by an anisotropic dry etching processing of an etching gas such as $CF_4$, so that a sacrifical film 103 is formed. By the patterning process, the sacrifical film 103 is partially removed excluding a part on which a movable electrode 109 will be formed in a later step (FIG. 8C).

Figure 8D:
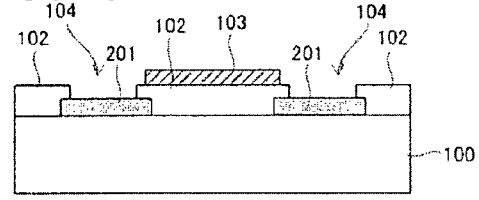

In a next step, a photomask is formed on the insulation film 102. Apertures 104 are formed by an anisotropic dry etching processing of an etching gas such as $CF_4$. Through the apertures 104, surfaces of the wiring-layer 201 formed in a region, on which fixed electrodes 142 and an anchor part 143 will be formed, are partially exposed (FIG. 8D). In a next step, a metal film 130 such as TiN with a thickness of, for instance, 0.2 um is formed over a structural body of FIG. 8D by a sputter-deposition technique (FIG. 8E).

Figure 8E:
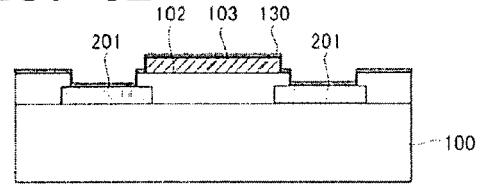
Figure 8F:
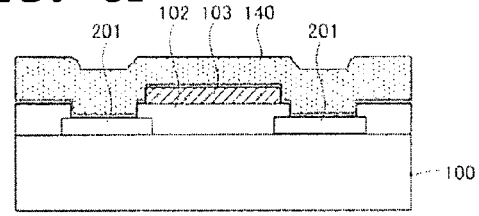
Figure 8G:
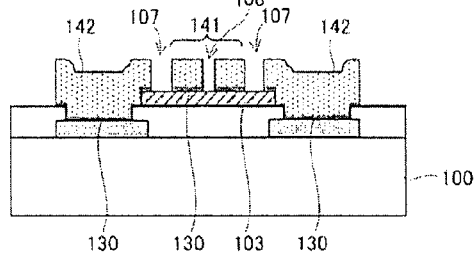

In a next step, an insulation film 140 such as AlN or $Al_2O_3$, both of which are structural materials of the fixed electrode and the movable electrode, is deposited on the structural body of FIG. 8E by a reactive sputtering so as to have a thickness of, for instance, about 1 to 3 um (FIG. 8F). In a next step, a photomask is formed on the insulation film 140. By patterning the insulation film 140 with an anisotropic dry etching processing of an etching gas such as $CF_4$, a movable electrode 141, fixed electrodes 142, and an anchor part 143 are formed. A slit 108 is formed into a center of the movable electrode 141 (FIG. 8G). The patterning process of the insulation film 140 is performed so that edges of the insulation film 140 are vertical and smooth. Through the patterning process of the insulation film 140, a gap 107 between the fixed electrodes 142 and the movable electrode 141 is formed so as to have a gap length of, for instance, about 0.3 to 11.0 um. It is configured that the gap length of the gap 107 in the patterning process is a final gap length of a final product. By forming the gap 107 having a comparatively large gap length in the patterning process, it is possible to prevent sticking phenomena after the sacrifical film is removed. The slit 108 located in the center of the movable electrode 141 is formed so as to have a slit width smaller than the gap length of gap 107. The slits 108 are utilized in a later step for the purpose of easily flowing an etchant into the sacrifical film 103 formed under the movable electrode 109, thus the sacrifical film 103 is easily etched.

In a next step, a metal film 131 consisting of a multilayer film of Ti/T is deposited on the structural body so as to have a thickness of 0.05 um by, for instance, a CVD method utilizing a $TiCl_4$. The metal films 131 is partially removed by etching back an upper surface thereof, so that only side and bottom surfaces of the fixed electrodes 142 and the movable electrode 141 are covered with the metal films 131. Therefore, the movable electrode 141 and the fixed electrodes 142 are conductive (FIG. 8H).

Figure 8H:
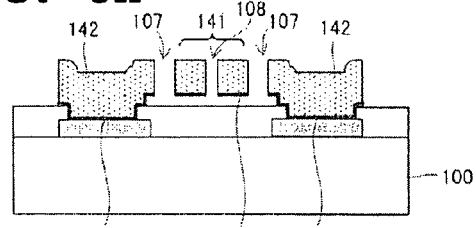

In a next, the sacrifical film 103 is etched by immersing the structure of FIG. 8H in hydrogen peroxide solution $H_2O_2$ as an etchant. By entering the etchant into the slits 108 and the gap 107, the sacrifical film 103 is easily removed, so that the movable electrode 109 is separated from the silicon substrate 100. A space allowing vibration of the movable electrode 109 is formed. The structural body, from which the sacrifical film 103 is removed, is washed, and dried (FIG. 8I).

Figure 8I:
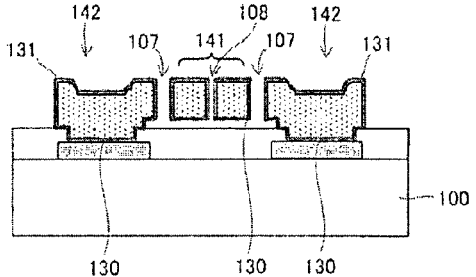
Figure 8J:
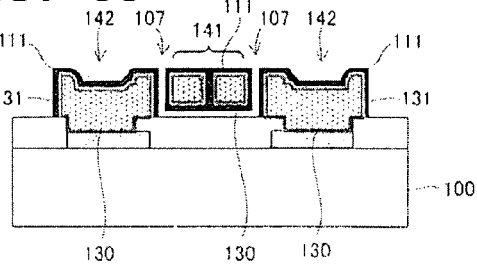

In a next step, conducting films 111 consisting of tungsten etc. are formed on the structural body of FIG. 8I by, for example, a LP-CVD method utilizing six fluoride tungsten $WF_6$ and hydrogen H2 as a reactant gas (FIG. 8J). Side surfaces of the fixed electrode 142 and side and bottom surfaces of the movable electrode 141 are covered with the conducting film 111. A thickness of the conducting film 111 defines the gap length of the gap 107 between the fixed electrodes 142 and the movable electrode 141. Accordingly, the gap length of the gap 107 is controlled by adjusting the thickness of the conducting film 111 in this step. When a gap length of the gap 107 is, for instance, 0.5 um before forming the conducting film 111, the conducting film 131 (Ti/T) with a thickness of 0.05 um is formed, and the conducting film 111 (Tungsten) with a thickness of 0.15 um is formed, it is estimated that a final gap length of the gap 107 is 0.1 um. Excluding tungsten, a material for forming the conducting film 111 may be other metals such as molybdenum and titanium.

In the manufacturing method of the MEMS resonator of the second embodiment according to the present invention, in the initial step, the gap formed between the movable electrode and the fixed electrode is formed so as to have a relatively large gap length. Then, the conducting film is uniformly deposited on the surfaces of the movable electrode and the fixed electrode so as to make the gap length in the initial step narrow. Thus, the gap having a gap length of 0.1 um is stable formed. In addition, the gap having a relatively large length is formed in the initial step, so that the sticking generation in the removal step of the sacrifical film can be effectively prevented. According to the method of manufacturing the second embodiment of the present invention, the surfaces of the movable electrode and the fixed electrodes are covered with the conductive metal film so that the electrodes are conductive. Thus, a high-resistance material and an insulating material, which can be formed at relatively low temperature, can be utilized as a structural material of the movable part. Therefore, the MEMS resonator according to the present invention is easily integrated with a semiconductor device having a circuit part.

The adjustment step of the resonance frequency described in the modification of the first embodiment can be applied to the method of the MEMS resonator of the second embodiment. In the first embodiment, the modification of the first embodiment, and the second embodiment of the present invention, the MEMS resonators of the tuning fork type are described. The micro electro-mechanical system according to the present invention is not limited to the tuning fork type. The micro electro-mechanical system according to the present invention can be applied to MEMS resonators having a cantilever structure or an interleaved structure. The micro electro-mechanical system according to the present invention can be also applied to a MEMS resonator having a narrow gap length.

This application is based on Japanese Patent Application No. 2007-063114 which is herein incorporated by reference.

What is claimed is:

1. A method of manufacturing a micro electro-mechanical system comprising at least one fixed electrode formed above a principal surface of a semiconductor substrate and at least one movable electrode formed on said principal surface, said at least one movable electrode including a movable part separated from said principal surface and said at least one fixed electrode, said movable part movable with respect to said principal surface and said at least one fixed electrode,
said method comprising:
a sacrifical film formation step for forming a sacrifical film above said principal surface;
an electrode layer formation step for forming an electrode layer above said principal surface so as to cover said sacrifical film;
an etching step for partially etching said electrode layer via a pattern so as to form said at least one electrode and said at least one fixed electrode;
a sacrifical film removal step for removing said sacrifical film; and
a conducting film formation step for forming a conducting film on surfaces of said at least one electrode and said at least one fixed electrode.

2. A method of manufacturing a micro electro mechanical system according to claim 1,
wherein
said electrode layer is formed from poly-silicon.

3. A method of manufacturing a micro electro mechanical system according to claim 1,
wherein
said electrode layer is formed from Poly-SiGe.

4. A method of manufacturing a micro electro mechanical system according to claim 1,
wherein
said electrode layer is a layered product comprising a conductive metallic film and an insulating film.

5. A method of manufacturing a micro electro mechanical system according to claim 1,
wherein
said conducting film is formed from tungsten.

6. A method of manufacturing a micro electro mechanical system according to claim 2,
wherein
said conducting film is formed from tungsten.

7. A method of manufacturing a micro electro mechanical system according to claim 3,
wherein
said conducting film is formed from tungsten.

8. A method of manufacturing a micro electro mechanical system according to claim 4,
wherein
said conducting film is formed from tungsten.

9. A method of manufacturing a micro electro mechanical system according to claim 1 further comprising:
a thickness estimation step for measuring a resonance frequency of said at least one movable electrode after said sacrifical film removal step so as to estimate a thickness of said conducting film on the basis of a difference between a measured resonance frequency and a design value,
wherein
said conducting film is formed in accordance with said thickness estimated in said thickness estimation step.

10. A method of manufacturing a micro electromechanical system according to claim 2 further comprising:
a thickness estimation step for measuring a resonance frequency of said at least one movable electrode after said sacrifical film removal step so as to estimate a thickness of said conducting film on the basis of a difference between a measured resonance frequency and a design value,
wherein
said conducting film is formed in accordance with said thickness estimated in said thickness estimation step.

11. A method of manufacturing a micro electromechanical system according to claim 3 further comprising:
a thickness estimation step for measuring a resonance frequency of said at least one movable electrode after said sacrifical film removal step so as to estimate a thickness of said conducting film on the basis of a difference between a measured resonance frequency and a design value,
wherein
said conducting film is formed in accordance with said thickness estimated in said thickness estimation step.

12. A method of manufacturing a micro electromechanical system according to claim 4 further comprising:
a thickness estimation step for measuring a resonance frequency of said at least one movable electrode after said sacrifical film removal step so as to estimate a thickness of said conducting film on the basis of a difference between a measured resonance frequency and a design value,
wherein
said conducting film is formed in accordance with said thickness estimated in said thickness estimation step.

13. A method of manufacturing a micro electromechanical system according to claim 5 further comprising:
a thickness estimation step for measuring a resonance frequency of said at least one movable electrode after said sacrifical film removal step so as to estimate a thickness of said conducting film on the basis of a difference between a measured resonance frequency and a design value,
wherein
said conducting film is formed in accordance with said thickness estimated in said thickness estimation step.

14. A method of manufacturing a micro electromechanical system comprising at least one fixed electrode formed above a principal surface of a semiconductor substrate and at least one movable electrode formed on said principal surface, said at least one movable electrode including a movable part separated from said principal surface and said at least one fixed electrode, said movable part movable with respect to said principal surface and said at least one fixed electrode,
said method comprising:
a sacrifical film formation step for forming a sacrifical film above said principal surface;

an electrode layer formation step for forming an electrode layer above said principal surface so as to cover over said sacrifical film;

an etching step for partially etching said electrode layer via a pattern so as to form said at least one electrode and said at least one fixed electrode;

a sacrifical film removal step for removing said sacrifical film;

a thickness estimation step for measuring a resonance frequency of said at least one movable electrode so as to estimate a thickness of a conducting film on the basis of a difference between a measured resonance frequency and a design value; and a conducting film formation step for forming said conducting film on surfaces of said at least one electrode and said at least one fixed electrode, said conducting film having a thickness in accordance with said thickness estimated in said thickness estimation step.

* * * * *